(12) United States Patent
Yang et al.

(10) Patent No.: US 10,387,580 B2
(45) Date of Patent: Aug. 20, 2019

(54) METHOD OF FORMING A FREEFORM SURFACE SHAPED ELEMENT FOR AN OPTICAL SYSTEM

(71) Applicants: Tsinghua University, Beijing (CN); HON HAI PRECISION INDUSTRY CO., LTD., New Taipei (TW)

(72) Inventors: Tong Yang, Beijing (CN); Jun Zhu, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 752 days.

(21) Appl. No.: 14/616,457

(22) Filed: Feb. 6, 2015

(65) Prior Publication Data

US 2015/0254375 A1    Sep. 10, 2015

(30) Foreign Application Priority Data

Mar. 5, 2014  (CN) .......................... 2014 1 0077829

(51) Int. Cl.
*G06F 17/50* (2006.01)
*G06F 17/12* (2006.01)
*G06T 17/30* (2006.01)

(52) U.S. Cl.
CPC .............. *G06F 17/50* (2013.01); *G06F 17/12* (2013.01); *G06T 17/30* (2013.01)

(58) Field of Classification Search
CPC .......... G06F 17/50; G06F 17/12; G06T 17/30
See application file for complete search history.

(56) References Cited

U.S. PATENT DOCUMENTS

| | | | | |
|---|---|---|---|---|
| 8,035,898 | B2 * | 10/2011 | Minano | G02B 27/0012 359/642 |
| 2005/0086032 | A1 * | 4/2005 | Benitez | G02B 27/0012 703/1 |
| 2008/0122922 | A1 * | 5/2008 | Geng | G08B 13/19628 348/39 |
| 2011/0270585 | A1 * | 11/2011 | Chen | G02B 27/30 703/1 |
| 2015/0127304 | A1 * | 5/2015 | Cassarly | G02B 27/0012 703/1 |

OTHER PUBLICATIONS

Chen et al., "Freeform surface design for a light-emitting diode-based collimating lens", Optical Engineering vol. 49, 093001 (Sep. 2010).*

(Continued)

*Primary Examiner* — Rehana Perveen
*Assistant Examiner* — Steven W Crabb
(74) *Attorney, Agent, or Firm* — ScienBiziP, P.C.

(57) ABSTRACT

A method for designing freeform surface is provided. An initial surface is established. A plurality of feature rays are selected. A plurality of intersections of the plurality of feature rays with an unknown freeform surface are calculated based on a given object-image relationship and a vector form of the Snell's law. The plurality of intersections are a plurality of feature data points. An unknown freeform surface equation is obtained by surface fitting the plurality of feature data points.

15 Claims, 6 Drawing Sheets

(56) References Cited

OTHER PUBLICATIONS

"Design of freeform imaging systems with linear field-of-view using a construction and iteration process", Tong Yang etc, Optics Express, Feb. 5, 2014, 3362-3374, vol. 22, No. 3.
Ding Yi, Design of Freeform Optical Devices and Their Applications in Illumination Systems, Chinese Doctoral Dissertations Full-text Database Engineering Science and Technology II , Dec. 15, 2010, 22-44, issue12, China.

* cited by examiner

METHOD OF FORMING A FREEFORM SURFACE SHAPED ELEMENT FOR AN OPTICAL SYSTEM

CROSS-REFERENCE TO RELATED APPLICATIONS

This application claims all benefits accruing under 35 U.S.C. § 119 from China Patent Application No. 201410077829.1, filed on Mar. 5, 2014 in the China Intellectual Property Office, disclosure of which is incorporated herein by reference. The application is also related to copending applications entitled, "OFF-AXIAL THREE-MIRROR OPTICAL SYSTEM WITH FREEFORM SURFACES", filed Dec. 16, 2014 Ser. No. 14/571,965; "OFF-AXIAL THREE-MIRROR OPTICAL SYSTEM WITH FREEFORM SURFACES", filed Dec. 16, 2014 Ser. No. 14/571,952; "METHOD FOR DESIGNING OFF-AXIAL THREE-MIRROR OPTICAL SYSTEM WITH FREEFORM SURFACES", filed Feb. 6, 2015 Ser. No. 14/616,463.

BACKGROUND

1. Technical Field

The present disclosure relates to a method for designing freeform surface, especially a method based on a point-by-point construction.

2. Description of Related Art

Compared with conventional rotationally symmetric surfaces, freeform optical surfaces have higher degrees of freedom, which can reduce the aberrations and simplify the structure of the system in optical design. In recent years, with the development of the advancing manufacture technologies, freeform surfaces have been successfully used in the optical field, such as head-mounted-displays, reflective systems, varifocal panoramic optical systems, and microlens arrays.

However, conventional methods mostly focus on designing a two-dimensional contour for freeform surfaces, and they are applied only to design optical systems with small aperture and linear field-of-view.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
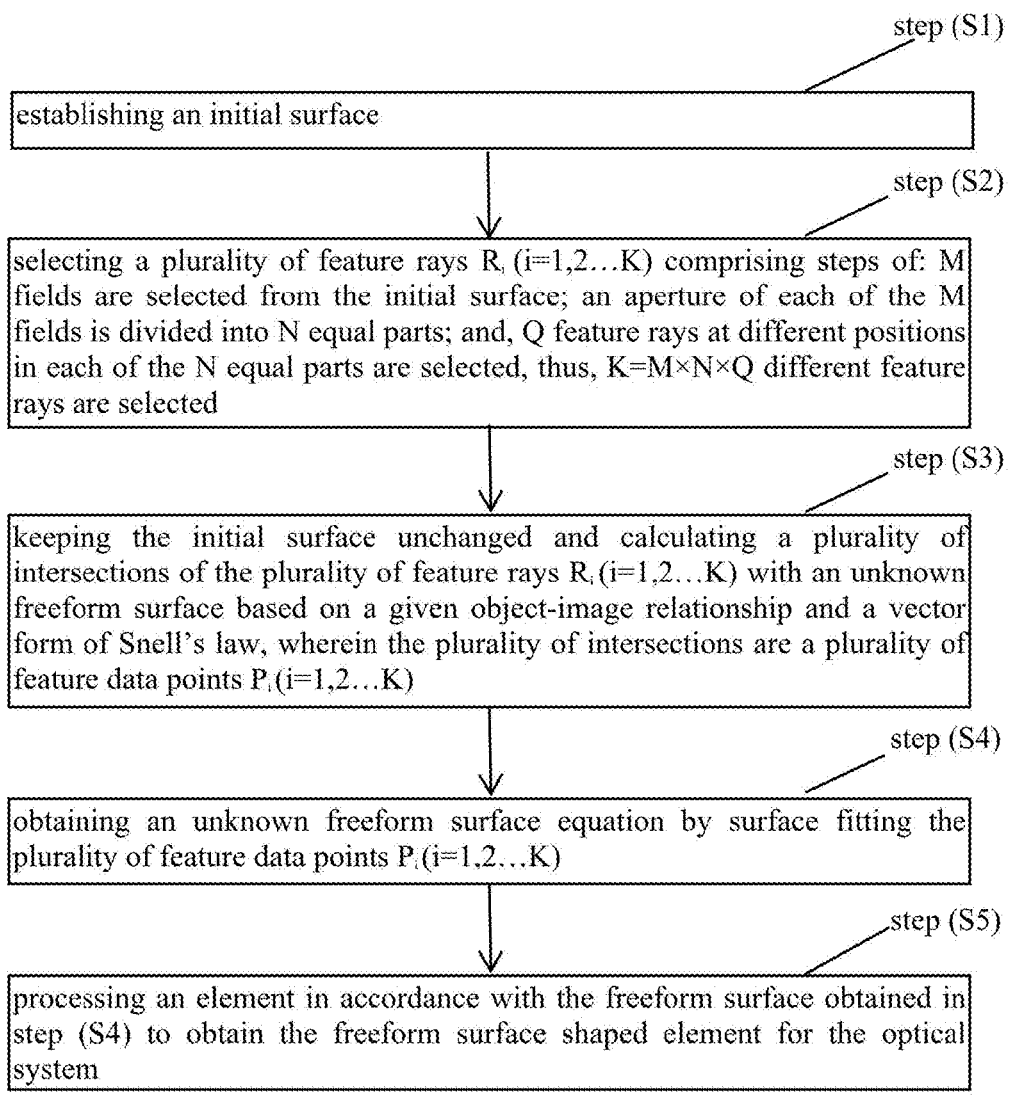
FIG. 1 shows a flow chart of one embodiment of a method for designing freeform surface.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. It should be noted that references to "one" embodiment in this disclosure are not necessarily to the same embodiment, and such references mean at least one.

Referring to FIG. 1, a method for designing freeform surface of one embodiment is provided. The method for designing freeform surface includes the following steps:

step (S1), establishing an initial surface;

step (S2), selecting a plurality of feature rays $R_i$ (i=1, 2 ... K);

step (S3), calculating a plurality of intersections of the plurality of feature rays $R_i$ (i=1, 2 ... K) with an unknown freeform surface based on a given object-image relationship and Snell's law, wherein the plurality of intersections are a plurality of feature data points $P_i$ (i=1, 2 ... K); and step (S4), obtaining an unknown freeform surface equation by surface fitting the plurality of feature data points $P_i$ (i=1, 2 ... K).

In step (S1), the initial surface can be planar, spherical, or other surface types. An initial surface location can be selected according to the optical system actual needs. In one embodiment, the initial surface is a planar.

In step (S2), a plurality of intersections of the plurality of feature rays $R_i$ (i=1, 2 ... K) and an image surface are close to a plurality of ideal image points $I_i$ (i=1, 2 ... K). The selecting a plurality of feature rays $R_i$ (i=1, 2 ... K) comprises includes steps of: M fields are selected according to the optical systems actual needs; an aperture of each of the M fields is divided into N equal parts; and, P feature rays at different aperture positions in each of the N equal parts are selected. As such, K=M×N×P different feature rays corresponding to different aperture positions and different fields are fixed. The aperture can be circle, rectangle, square, oval or other shapes.

Figure 2:
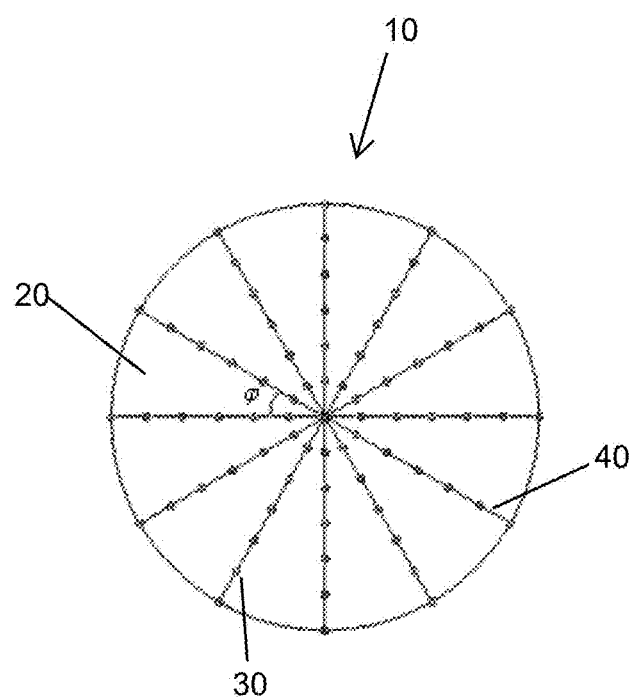
FIG. 2 is a schematic view of a selecting method of a plurality of feature rays employed in each field.

FIG. 2 illustrates that in one embodiment, the aperture of each of the M fields is a circle, and a circular aperture 10 of each of the M fields is divided into N angles 20 with equal interval φ, as such, N=2π/φ; then, P different aperture positions 30 are fixed along a radial direction 40 of each of the N angles. Therefore, K=M×N×P different feature rays corresponding to different aperture positions and different fields are fixed. In one embodiment, six fields are fixed in the construction process; a circular aperture of each of the six fields is divided into fourteen angles with equal intervals; and seven different aperture positions are fixed along the radial direction of each of the fourteen angles. Therefore, 588 different feature rays corresponding to different aperture positions and different fields are fixed.

Figure 3A:
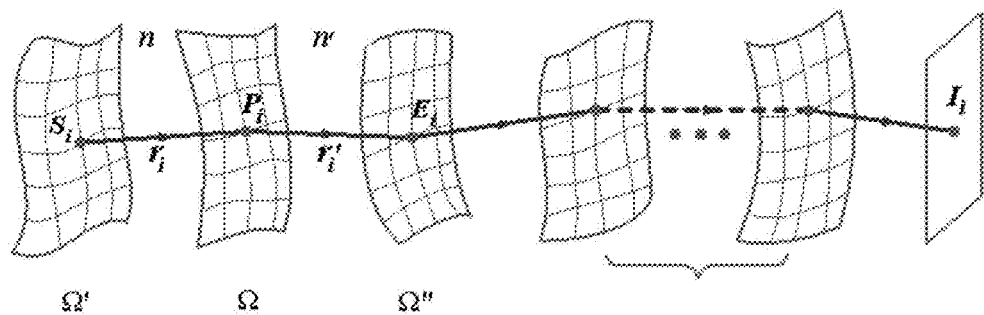
FIG. 3A is a schematic view of start point and end point of one feature ray while solving the feature data points.

In step (S3), referring to FIG. 3A, a surface Ω is defined as the unknown freeform surface, a surface Ω' is defined as a surface located adjacent to and before the surface Ω, and a surface Ω" is defined as a surface located adjacent to and behind the surface Ω. Defining the intersections of the plurality of feature rays $R_i$ (i=1, 2 . . . K) with the surface Ω as the feature data points $P_i$ (i=1, 2 . . . K). The feature data points $P_i$ (i=1, 2 . . . K) can be obtained by the intersections of the feature rays $R_i$ (i=1, 2 . . . K) with the surface Ω' and the surface Ω". The plurality of feature rays $R_i$ (i=1, 2 . . . K) are intersected with Ω' at a plurality of start points $S_i$ (i=1, 2 . . . K), and intersected with Ω" at a plurality of end points $E_i$ (i=1, 2 . . . K). When the surface Ω and the plurality of feature rays $R_i$ (i=1, 2 . . . K) are determined, the plurality of start points $S_i$ (i=1, 2 . . . K) of the feature rays $R_i$ (i=1, 2 . . . K) can also be determined. The plurality of end points $E_i$ (i=1, 2 . . . K) can be obtained based on the object-image relationship. Under ideal conditions, the feature rays $R_i$ (i=1, 2 . . . K) emit from the plurality of start points $S_i$ (i=1, 2 . . . K) on Ω'; pass through the feature data points $P_i$ (i=1, 2 . . . K) on the surface Ω; intersect with Ω" at the plurality of end points $E_i$ (i=1, 2 . . . K); and finally intersect with the image plane at the plurality of ideal image points $I_i$ (i=1, 2 . . . K). If the surface Ω" is the image plane, the plurality of end points $E_i$ (i=1, 2 . . . K) are the plurality of ideal image points $I_i$ (i=1, 2 . . . K). If there are other surfaces between the surface Ω and the image plane, the plurality of end points $E_i$ (i=1, 2 . . . K) are the points on the surface Ω" which minimizes an optical path length between the feature data points $P_i$ (i=1, 2 . . . K) and the ideal image points $I_i$ (i=1, 2 . . . K).

The plurality of feature data points $P_i$ (i=1, 2 . . . K) can be obtained by the following two calculating methods.

Figure 3B:
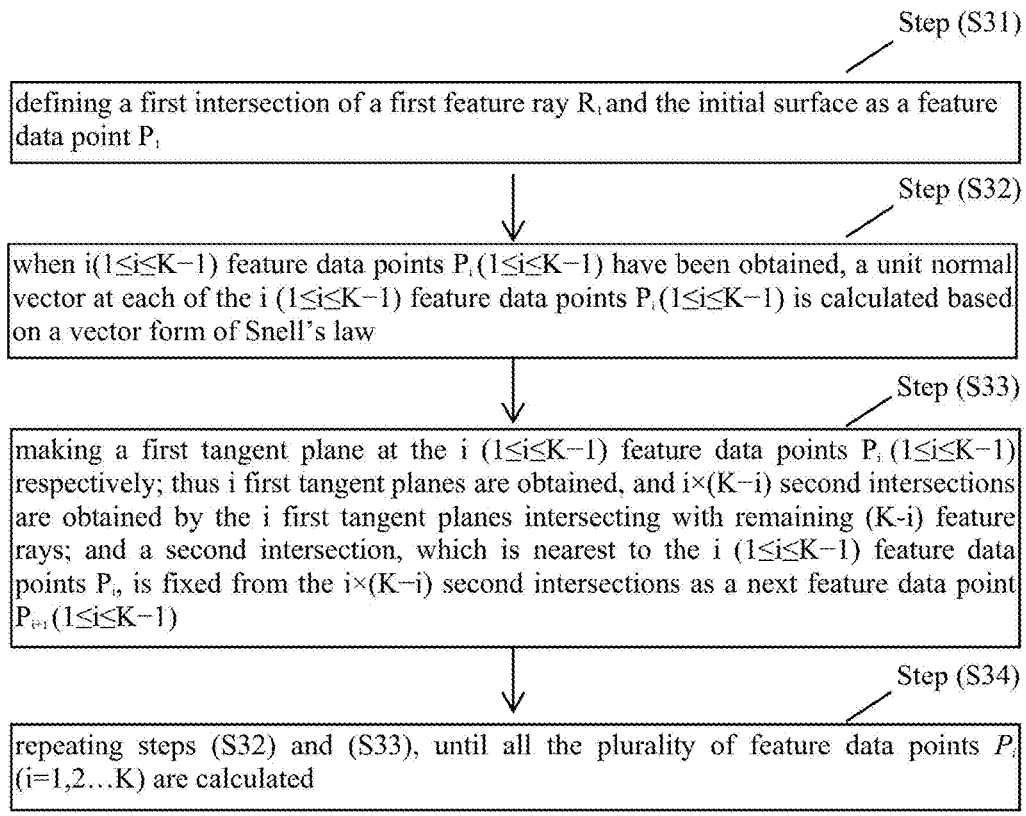
FIG. 3B shows a flow chart of one embodiment of a method for calculating a plurality of feature data points $P_i$ (i=1, 2 ... K).

Referring to FIG. 3B, a first calculating method includes the following sub-steps:

Step (S31): defining a first intersection of a first feature ray $R_1$ and the initial surface as a feature data point $P_1$;

Step (S32): when i (1≤i≤K−1) feature data points $P_i$ (1≤i≤K−1) have been obtained, a unit normal vector $\vec{N}_i$ (1≤i≤K−1) at each of the i (1≤i≤K−1) feature data points $P_i$ (1≤i≤K−1) can be calculated based on a vector form of Snell's Law;

Step (S33): making a first tangent plane at the i (1≤i≤K−1) feature data points $P_i$ (1≤i≤K−1) respectively; thus i first tangent planes can be obtained, and i×(K−i) second intersections can be obtained by the i first tangent planes intersecting with remaining (K−i) feature rays; and a second intersection, which is nearest to the i (1≤i≤K−1) feature data points $P_i$, is fixed from the i×(K−i) second intersections as a next feature data point $P_{i+1}$ (1≤i≤K−1); and Step (S34): repeating steps S32 and S33, until all the plurality of feature data points $P_i$ (i=1, 2 . . . K) are calculated.

In step (S32), the unit normal vector $\vec{N}_i$ (1≤i≤K−1) at each of the feature data point $P_i$ (1≤i≤K−1) can be calculated based on the vector form of Snell's Law. When the unknown freeform surface is a refractive second surface, $$\vec{N}_i = \frac{n'\vec{r}'_i - n\vec{r}_i}{|n'\vec{r}'_i - n\vec{r}_i|} \quad (1)$$

is a unit vector along a direction of an incident ray of the unknown freeform surface;

$$\vec{r}'_i = \frac{\overrightarrow{E_iP_i}}{|\overrightarrow{E_iP_i}|}$$

is a unit vector along a direction of an exit ray of the unknown freeform surface; and n, n' is refractive index of a media at two opposite sides of the unknown freeform surface respectively.

Similarly, when the unknown freeform surface is a reflective surface, $$\vec{N}_i = \frac{\vec{r}'_i - \vec{r}_i}{|\vec{r}'_i - \vec{r}_i|} \quad (2)$$

The unit normal vector $\vec{N}_i$ at the feature data points $P_i$ (i=1, 2 . . . K) is perpendicular to the first tangent plane at the feature data points $P_i$ (i=1, 2 . . . K). Thus, the first tangent planes at the feature data points $P_i$ (i=1, 2 . . . K) can be obtained.

The first calculating method includes a computational complexity formula of $$T(K) = \sum_{i=1}^{K-1} i(K-i) = \frac{1}{6}K^3 - \frac{1}{6}K = O(K^3).$$

When multi-feature rays are used in a design, the first calculating method requires a long computation time.

Figure 3C:
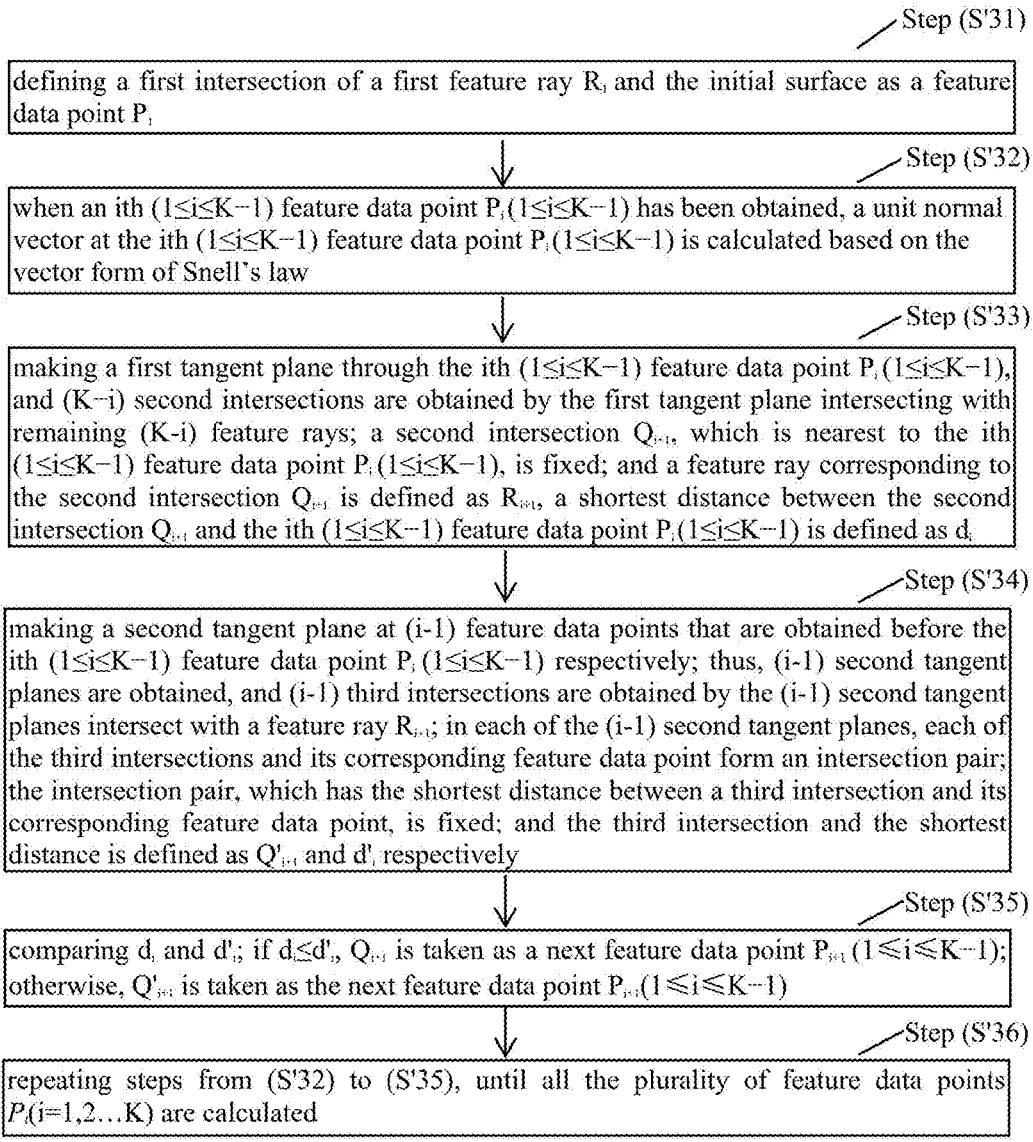
FIG. 3C shows a flow chart of one embodiment of a method for calculating a plurality of feature data points $P_i$ (i=1, 2 ... K).

Referring to FIG. 3C, a second calculating method includes the following sub-steps:

Step (S'31): defining a first intersection of a first feature ray $R_1$ and the initial surface as a feature data point $P_1$;

Step (S'32): when an ith (1≤i≤K−1) feature data point $P_i$ (1≤i≤K−1) has been obtained, unit normal vector $\vec{N}_i$ at the ith (1≤i≤K−1) feature data point $P_i$ (1≤i≤K−1) is calculated based on the vector form of Snell's law;

Step (S'33): making a first tangent plane through the ith (1≤i≤K−1) feature data point $P_i$ (1≤i≤K−1), and (K−i) second intersections are obtained by the first tangent plane intersecting with remaining (K−i) feature rays; a second intersection $Q_{i+1}$, which is nearest to the ith (1≤i≤K−1) feature data point $P_i$ (1≤i≤K−1), is fixed; and a feature ray corresponding to the second intersection $Q_{i+1}$ is defined as $R_{i+1}$, a shortest distance between the second intersection $Q_{i+1}$ and the ith (1≤i≤K−1) feature data point $P_i$ (1≤i≤K−1) is defined as $d_i$;

Step (S'34): making a second tangent plane at (i−1) feature data points that are obtained before the ith (1≤i≤K−1) feature data point $P_i$ (1≤i≤K−1) respectively; thus, (i−1) second tangent planes are obtained, and (i−1) third intersections are obtained by the (i−1) second tangent planes intersect with a feature ray $R_{i+1}$; in each of the (i−1) second tangent planes, each of the third intersections and its corresponding feature data point form an intersection pair; the intersection pair, which has the shortest distance between a third intersection and its corresponding feature data point, is fixed; and the third intersection and the shortest distance is defined as $Q'_{i+1}$ and $d'_i$ respectively;

Step (S'35): comparing $d_i$ and $d'_i$; if $d_i \leq d'_i$, $Q_{i+1}$ is taken as a next feature data point $P_{i+1}$ ($1 \leq i \leq K-1$); otherwise, $Q'_{i+1}$ is taken as the next feature data point $P_{i+1}$ ($1 \leq i \leq K-1$); and Step (S'36): repeating steps from (S'32) to (S'35), until all the plurality of feature data points $P_i$ (i=1, 2 . . . K) are calculated.

In Step (S'32), a calculating method of the unit normal vector $\vec{N}_i$ at the ith ($1 \leq i \leq K-1$) feature data point $P_i$ ($1 \leq i \leq K-1$) is the same as the first calculating method.

A second calculating method includes a computational complexity formula of $$T(K) = \sum_{i=1}^{K-1} K - i + i - 1 = (K-1)^2 = O(K^2).$$

When multi-feature rays are used in a design, the computational complexity of the second calculating method is smaller than the computational complexity of the first calculating method. In one embodiment, constructing the plurality of feature data points $P_i$ (i=1, 2 . . . K) point by point using the second calculating method.

In some embodiments, the freeform surface obtained in one embodiment can be the initial surface for further optimization.

Figure 4:
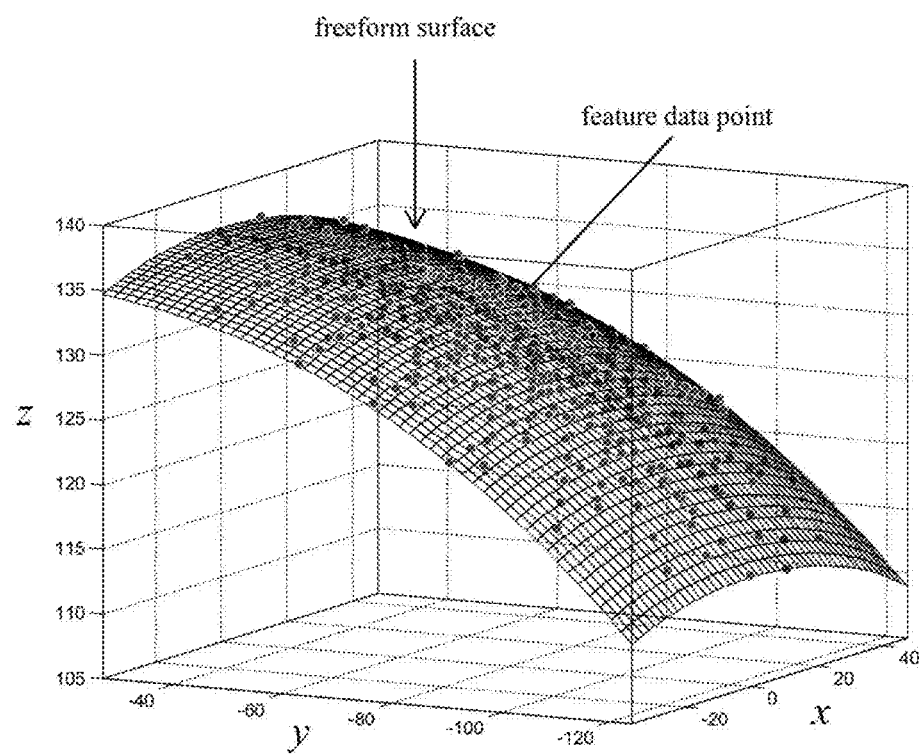
FIG. 4 shows a schematic view of one embodiment of a freeform surface obtained by the method in FIG. 1.

Referring to FIG. 4, in one embodiment, the plurality of feature data points $P_i$ (i=1, 2 . . . 588) are obtained by the second calculating method, the plurality of feature data points $P_i$ (i=1, 2 . . . 588) are the intersections of the different feature rays and the unknown freeform surface. The unknown freeform surface is obtained by surface fitting the plurality of feature data points $P_i$ (i=1, 2 . . . 588).

The designing method of freeform surface is based on a point by point construction, and optical relationships of the feature rays formed between the unknown freeform surface and the surfaces adjacent to the unknown freeform surface, a three-dimensional freeform surface can be obtained by the designing method. And the designing method is simple and can be applied to various off-axis asymmetric systems. Furthermore, the designing method can be applied to imaging systems with multi-fields and certain aperture, by controlling the feature rays of the multi-fields and different aperture positions; and the number of fields is not limited, thus, the design method has a broad application use.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of constructing a three-dimensional freeform surface shaped mirror of an optical system comprising:
    step (S1), establishing an initial surface;
    step (S2), selecting a plurality of feature rays $R_i$ (i=1, 2 . . . K) comprising steps of: M fields are selected from the initial surface; an aperture of each of the M fields is divided into N equal parts; and, Q feature rays at different positions in each of the N equal parts are selected, thus, K=M×N×Q different feature rays are selected;
    step (S3), keeping the initial surface unchanged and calculating a plurality of intersections of the plurality of feature rays $R_i$ (i=1, 2 . . . K) with an unknown freeform surface based on a given object-image relationship and a vector form of Snell's law, wherein the plurality of intersections are a plurality of feature data points $P_i$ (i=1, 2 . . . K);
    step (S4), obtaining a three-dimensional freeform surface by surface fitting the plurality of feature data points $P_i$ (i=1, 2 . . . K); and
    step (S5), constructing the three-dimensional freeform surface shaped mirror of the optical system based on the three-dimensional freeform surface obtained in step (S4).

2. The method of claim 1, wherein the aperture of each of the M fields is a circle.

3. The method of claim 2, wherein the aperture of each of the M fields is divided into N angles with equal intervals.

4. The method of claim 3, wherein the Q different positions are selected along a radial direction of each of the N angles.

5. The method of claim 1, wherein $\Omega$ is defined as the unknown freeform surface, $\Omega'$ is defined as a surface located adjacent to and before $\Omega$, and $\Omega''$ is defined as a surface located adjacent to and behind $\Omega$; based on the given object-image relationship the plurality of feature rays $R_i$ (i=1, 2 . . . K) and $\Omega'$ intersect at a plurality of start points $S_i$ (i=1, 2 . . . K), and the plurality of feature rays $R_i$ (i=1, 2 . . . K) and $\Omega''$ intersect at a plurality of end points $E_i$ (i=1, 2 . . . K).

6. The method of claim 5, wherein $\Omega''$ is the image plane, and the plurality of end points $E_i$ (i=1, 2 . . . K) are the plurality of ideal image points $I_i$ (i=1, 2 . . . K).

7. The method of claim 5, wherein there are other surfaces between the unknown freeform surface and the image plane, and the plurality of end points $E_i$ (i=1, 2 . . . K) are a plurality of points on $\Omega''$ which minimizes an optical path length between the plurality of feature data points $P_i$ (i=1, 2 . . . K) and the plurality of ideal image points $I_i$ (i=1, 2 . . . K).

8. The method of claim 5, wherein a unit normal vector $\vec{N}_i$ at each of the plurality of feature data points $P_i$ (i=1, 2 . . . K) is calculated based on the vector form of Snell's law, the unknown freeform surface is a refractive surface, and:

$$\vec{N}_i = \frac{n'\vec{r}'_i - n\vec{r}_i}{|n'\vec{r}'_i - n\vec{r}_i|};$$

wherein $$\vec{r}_i = \frac{\vec{P_i S_i}}{|\vec{P_i S_i}|}$$

is a unit vector along a direction of an incident ray of the unknown freeform surface;

$$\vec{r}'_i = \frac{\overline{E_i P_i}}{|\overline{E_i P_i}|}$$

is a unit vector along a direction of an exit ray of the unknown freeform surface; and n, n' is refractive index of a media at two opposite sides of the unknown freeform surface respectively.

9. The method of claim 5, wherein a unit normal vector $\vec{N}_i$ at each of the feature data points $P_i$ is calculated based on the vector form of Snell's law, the unknown freeform surface is a reflective surface, and:

$$\vec{N}_i = \frac{\vec{r}'_i - \vec{r}_i}{|\vec{r}'_i - \vec{r}_i|};$$

wherein $$\vec{r}_i = \frac{\overline{P_i S_i}}{|\overline{P_i S_i}|}$$

is a unit vector along a direction of an incident ray of the unknown freeform surface;

$$\vec{r}'_i = \frac{\overline{E_i P_i}}{|\overline{E_i P_i}|}$$

is a unit vector along a direction of an exit ray of the unknown freeform surface.

10. The method of claim 1, wherein the calculating a plurality of intersections of the plurality of feature rays $R_i$ (i=1, 2 . . . K) with an unknown freeform surface based on a given object-image relationship and a vector form of the Snell's law comprises:
Step (S31): defining a first intersection of a first feature ray $R_1$ and the initial surface as a feature data point $P_1$;
Step (S32): when i (1≤i≤K−1) feature data points $P_i$(1≤i≤K−1) have been obtained, a unit normal vector $\vec{N}_i$ (1≤i≤K−1) at each of the i (1≤i≤K−1) feature data points $P_i$ (1≤i≤K−1) is calculated based on a vector form of Snell's law;
Step (S33): making a first tangent plane at the i (1≤i≤K−1) feature data points $P_i$ (1≤i≤K−1) respectively; thus i first tangent planes are obtained, and i×(K−i) second intersections are obtained by the i first tangent planes intersecting with remaining (K−i) feature rays; and a second intersection, which is nearest to the i (1≤i≤K−1) feature data points $P_i$, is fixed from the i×(K−i) second intersections as a next feature data point $P_{i+1}$ (1≤i≤K−1); and
Step (S34): repeating steps (S32) and (S33), until all the plurality of feature data points $P_i$ (i=1, 2 . . . K) are calculated.

11. The method of claim 10, wherein a computational complexity of the method is calculated via an equation $$T(K) = \sum_{i=1}^{K-1} i(K-i) = \frac{1}{6}K^3 - \frac{1}{6}K = O(K^3).$$

wherein T is the computational complexity of the method, and O is an equation of K cubed.

12. The method of claim 1, wherein the calculating a plurality of intersections of the plurality of feature rays $R_i$ (i=1, 2 . . . K) with an unknown freeform surface based on a given object-image relationship and a vector form of the Snell's law comprises:
Step (S'31): defining a first intersection of a first feature ray $R_1$ and the initial surface as a feature data point $P_1$;
Step (S'32): when an ith (1≤i≤K−1) feature data point $P_i$ (1≤i≤K−1) has been obtained, a unit normal vector $\vec{N}_i$ at the ith (1≤i≤K−1) feature data point $P_i$ (1≤i≤K−1) is calculated based on the vector form of Snell's law;
Step (S'33): making a first tangent plane through the ith (1≤i≤K−1) feature data point $P_i$ (1≤i≤K−1), and (K−i) second intersections are obtained by the first tangent plane intersecting with remaining (K−i) feature rays; a second intersection $Q_{i+1}$, which is nearest to the ith (1≤i≤K−1) feature data point $P_i$ (1≤i≤K−1), is fixed; and a feature ray corresponding to the second intersection $Q_{i+1}$ is defined as $R_{i+1}$, a shortest distance between the second intersection $Q_{i+1}$ and the ith (1≤i≤K−1) feature data point $P_i$ (1≤i≤K−1) is defined as $d_i$;
Step (S'34): making a second tangent plane at (i−1) feature data points that are obtained before the ith (1≤i≤K−1) feature data point $P_i$ (1≤i≤K−1) respectively; thus, (i−1) second tangent planes are obtained, and (i−1) third intersections are obtained by the (i−1) second tangent planes intersect with a feature ray $R_{i+1}$; in each of the (i−1) second tangent planes, each of the third intersections and its corresponding feature data point form an intersection pair; the intersection pair, which has the shortest distance between a third intersection and its corresponding feature data point, is fixed; and the third intersection and the shortest distance is defined as $Q'_{i+1}$ and $d'_i$ respectively;
Step (S'35): comparing $d_i$ and $d'_i$; if $d_i \leq d'_i$, $Q_{i+1}$ is taken as a next feature data point $P_{i+1}$ (1≤i≤K−1); otherwise, $Q'_{i+1}$ is taken as the next feature data point $P_{i+1}$ (1≤i≤K−1); and
Step (S'36): repeating steps from (S'32) to (S'35), until all the plurality of feature data points $P_i$ (i=1, 2 . . . K) are calculated.

13. The method of claim 12, wherein a computational complexity of the method is calculated via an equation $$T(K) = \sum_{i=1}^{K-1} K - i + i - 1 = (K-1)^2 = O(K^2).$$

wherein T is the computational complexity of the method, and O is an equation of K square.

14. The method of claim 1, wherein the optical system is a head-mounted-display, a reflective system, a varifocal panoramic optical system, or a micro-lens array.

15. The method of claim 1, wherein the optical system is an imaging system with multi-fields.

* * * * *